(12) United States Patent
Cheng et al.

(10) Patent No.: US 7,591,368 B2
(45) Date of Patent: Sep. 22, 2009

(54) GLASS SUBSTRATE CARRIER WITH A NON-CONTACT BRAKE ASSEMBLY

(75) Inventors: Jui-Chung Cheng, Hsinchu (TW); Summit Lin, Hsinchu (TW)

(73) Assignee: Prime View International Co., Ltd. (TW)

( * ) Notice: Subject to any disclaimer, the term of this patent is extended or adjusted under 35 U.S.C. 154(b) by 520 days.

(21) Appl. No.: 11/495,672

(22) Filed: Jul. 31, 2006

(65) Prior Publication Data
US 2008/0036130 A1 Feb. 14, 2008

(51) Int. Cl.
*B65G 25/00* (2006.01)
(52) U.S. Cl. ............ 198/750.2; 198/750.1; 198/750.13; 414/749.2
(58) Field of Classification Search .............. 198/750.1, 198/750.2, 750.13; 414/749.2; 310/26
See application file for complete search history.

(56) References Cited

U.S. PATENT DOCUMENTS

| | | | | | |
|---|---|---|---|---|---|
| 2,135,986 | A | * | 11/1938 | Morton et al. .............. | 198/430 |
| 3,235,100 | A | * | 2/1966 | Raynor .................... | 414/790.1 |
| 3,765,037 | A | * | 10/1973 | Dunkin ...................... | 5/81.1 C |
| 5,622,251 | A | * | 4/1997 | Rantanen .................... | 198/747 |
| 5,699,897 | A | * | 12/1997 | Svejkovsky ............. | 198/750.8 |
| 5,934,445 | A | * | 8/1999 | Foster et al. ............. | 198/750.5 |
| 6,183,183 | B1 | * | 2/2001 | Goodwin et al. ............ | 414/217 |
| 6,308,821 | B1 | * | 10/2001 | Asai et al. ................ | 198/750.7 |
| 6,361,268 | B1 | * | 3/2002 | Pelrine et al. ............ | 414/749.2 |
| 6,899,218 | B2 | * | 5/2005 | Kwasniewicz et al. ... | 198/750.7 |
| 7,070,041 | B1 | * | 7/2006 | Dirschbacher et al. ... | 198/750.1 |
| 7,282,819 | B2 | * | 10/2007 | Korenaga .................... | 310/12 |
| 7,479,605 | B2 | * | 1/2009 | Cheng et al. ................ | 174/542 |

OTHER PUBLICATIONS

US PG Pub US2008/0087510 A1 "Motion Retarding System and Method", Pribonic, Apr. 17, 2008.*

* cited by examiner

*Primary Examiner*—Douglas A Hess
(74) *Attorney, Agent, or Firm*—Hershkovitz & Associates, LLC; Abraham Hershkovitz

(57) ABSTRACT

A glass substrate carrier has a base, a tray assembly, a transmission device and a non-contact brake assembly. The base is movable. The tray assembly has a tray slidably mounted on the base and holding a glass substrate. The transmission device is mounted between the base and the tray assembly and is capable of driving the tray to extend out or retract back to the base. The non-contact brake assembly has a first brake element mounted on the base and a second brake element mounted on the tray assembly and un-contacting the first brake element. The first and second brake elements attract each other with an attractive force to brake a movement of the tray of the tray assembly. The first and second brake elements do not rub against each other and no dust is generated to damage circuit on the glass substrate.

7 Claims, 8 Drawing Sheets

GLASS SUBSTRATE CARRIER WITH A NON-CONTACT BRAKE ASSEMBLY

BACKGROUND OF THE INVENTION

1. Field of the Invention

The present invention relates to a carrier, and more particularly to a glass substrate carrier that has a tray assembly and a non-contact brake assembly braking the tray assembly with an attractive force without generating dust.

2. Description of Related Art

Liquid crystal displays (LCDs) are light and compact and are used widely in the world at present. The fabrication of the LCDs is in a clean environment. The core element of a LCD, a glass substrate has to be manufactured and carried in the clean room without any dust that probably damages film transistors or microcircuits on the glass substrate.

With reference to FIGS. 6 and 7, a conventional glass substrate carrier used in a clean room to hold and carry glass substrate comprises base (90), a tray (91), a transmission device (92), a handle (93) and a brake device (94).

The base (90) is movable on the ground and has multiple wheels.

The tray (91) is mounted slidably on the base (90) and may hold a glass substrate.

The transmission device (92) is mounted on the base (90), is connected to the tray (91) and is capable of sliding the tray (91).

The handle (93) is mounted rotatably on the base (10) and is connected to the transmission device (94). Rotating the handle (93) drives the transmission device (92) to extend or retract the tray (91).

The brake assembly (94) is mounted on the base (90) and the tray (91) and has a first brake element (941) and a second brake element (942). The first brake element (941) is mounted on the tray (91) and has a braking ball mounted on the brake element (941). The second brake element (942) is mounted on the base (90) and has two reverse-V-shaped protrusions formed on the second brake element (942) and a V-shaped recess defined between the reverse-V-shaped protrusions.

When the tray (91) carrying a glass substrate is retracted by the transmission device (92) in response to the handle (93), the braking ball of the first brake element (941) on the tray (91) collides one reverse-V-shaped protrusion and is stuck in the V-shaped recess of the second brake element (942) to stop the movement of the tray (91).

However, the collision of the braking ball and the reverse-V-shaped protrusion generates shatters and dust, which may attach to the glass substrate and damage microcircuits of the glass substrate.

To overcome the shortcomings, the present invention provides a glass substrate carrier with a non-contact brake assembly to mitigate or obviate the aforementioned problems.

SUMMARY OF THE INVENTION

The main objective of the invention is to provide a glass substrate carrier that has a tray assembly and a non-contact brake assembly braking the tray assembly with an attractive force without generating dust.

A glass substrate carrier in accordance with the present invention comprises a base, a tray assembly, a transmission device and a non-contact brake assembly. The base is movable. The tray assembly has a tray slidably mounted on the base and holding a glass substrate. The transmission device is mounted between the base and the tray assembly and is capable of driving the tray to extend out or retract back to the base. The non-contact brake assembly has a first brake element mounted on the base and a second brake element mounted on the tray assembly, un-contacting the first brake element. The first and second brake elements attract each other with an attractive force to brake a movement of the tray of the tray assembly.

Other objectives, advantages and novel features of the invention will become more apparent from the following detailed description when taken in conjunction with the accompanying drawings.

DETAILED DESCRIPTION OF THE PREFERRED EMBODIMENT

Figure 1:
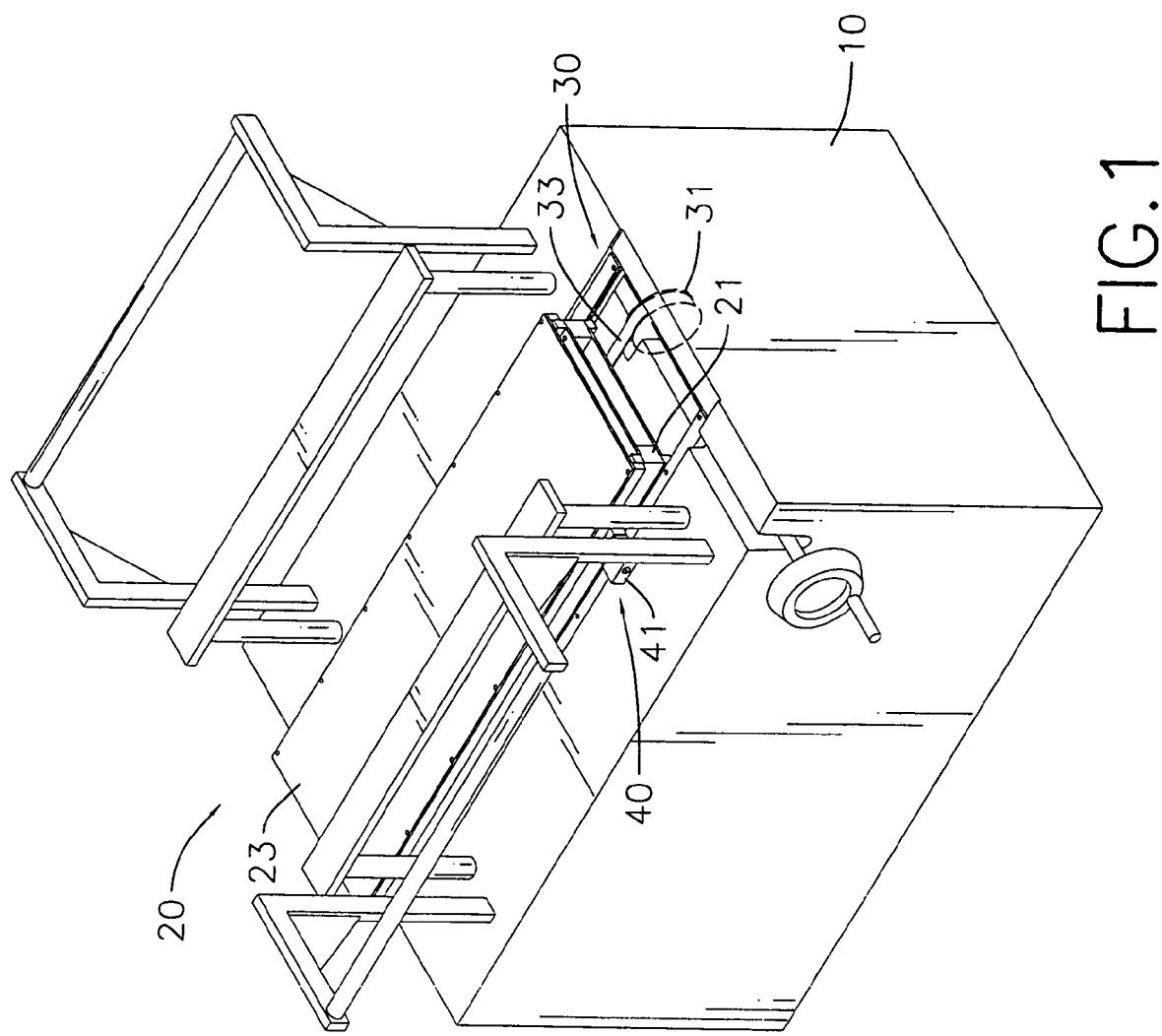
FIG. 1 is a perspective view of a glass substrate carrier with a non-contact brake assembly in accordance with the present invention.
Figure 2:
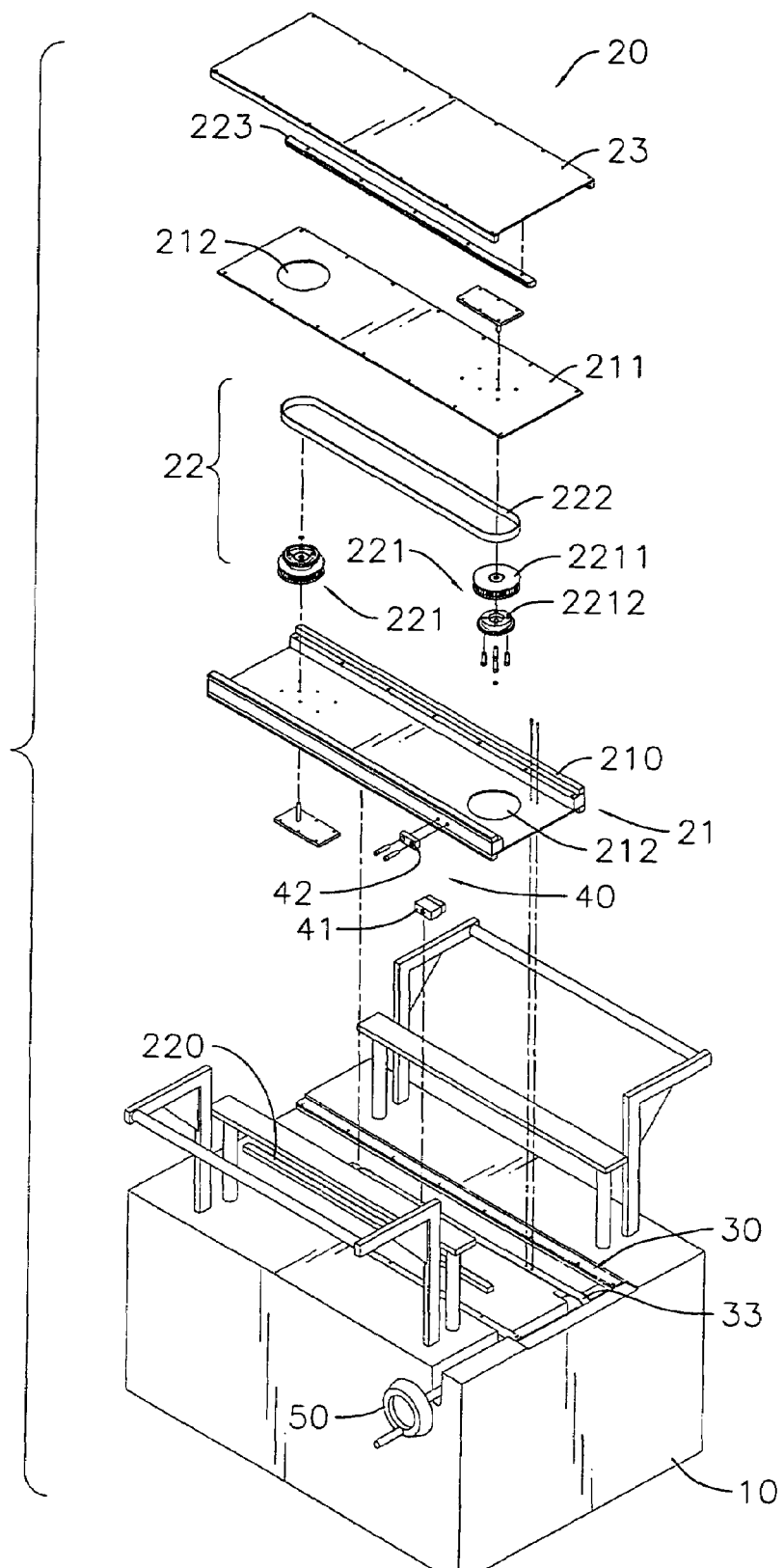
FIG. 2 is an exploded perspective view of the glass substrate carrier in FIG. 1.

With reference to FIGS. 1 and 2, a glass substrate carrier in accordance with the present invention comprises a base (10), a tray assembly (20), a transmission device (30), a non-contact brake assembly (40) and a handle (50).

The base (10) is movable on the ground, has a top and may have multiple wheels mounted under base (10).

The tray assembly (20) is mounted on the base (10) and has a linkage slide (21), a tray (23) and a connection assembly (22).

The linkage slide (21) is mounted slidably on the top of the base (10) and has a seat (210), a cover (211) and an inner cavity. The seat (210) is mounted slidably on the top of the base (10) and has two opposite sidewalls and a bottom through hole defined through the seat (210). The cover (211) is mounted on the sidewalls of the seat (210) and has a top through hole defined through the cover (211). The cavity is defined in the linkage slide (21) between the seat (210) and the cover (211).

The tray (23) is mounted slidably on the linkage slide (21) on the base (10), is capable of extending out from the base (10) to receive a glass substrate or retracting back to the base (10) to carry the glass substrate and has a bottom.

Figure 2A:
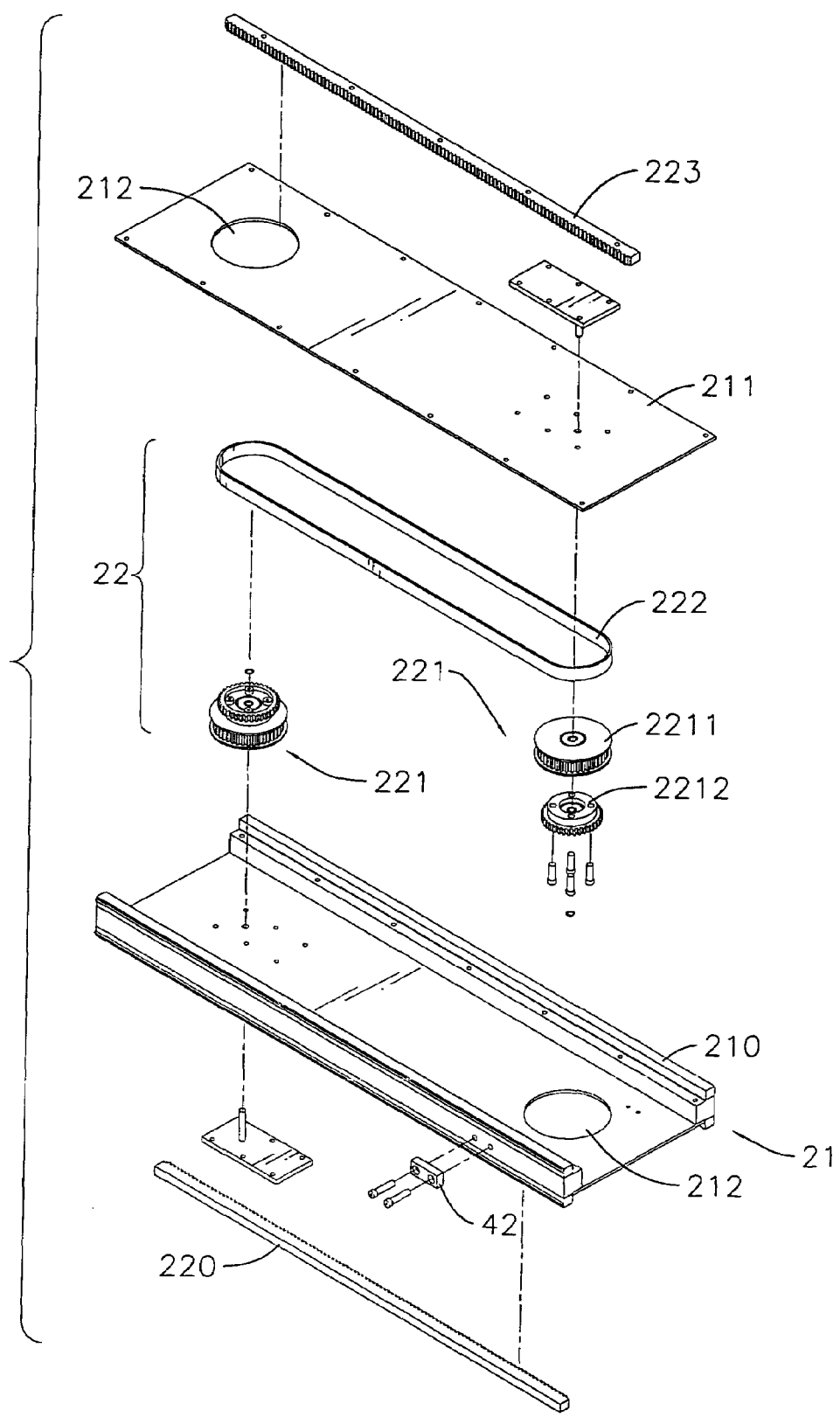
FIG. 2A is an exploded perspective view of the tray assembly of the glass substrate carrier in FIG. 2.
Figure 3:
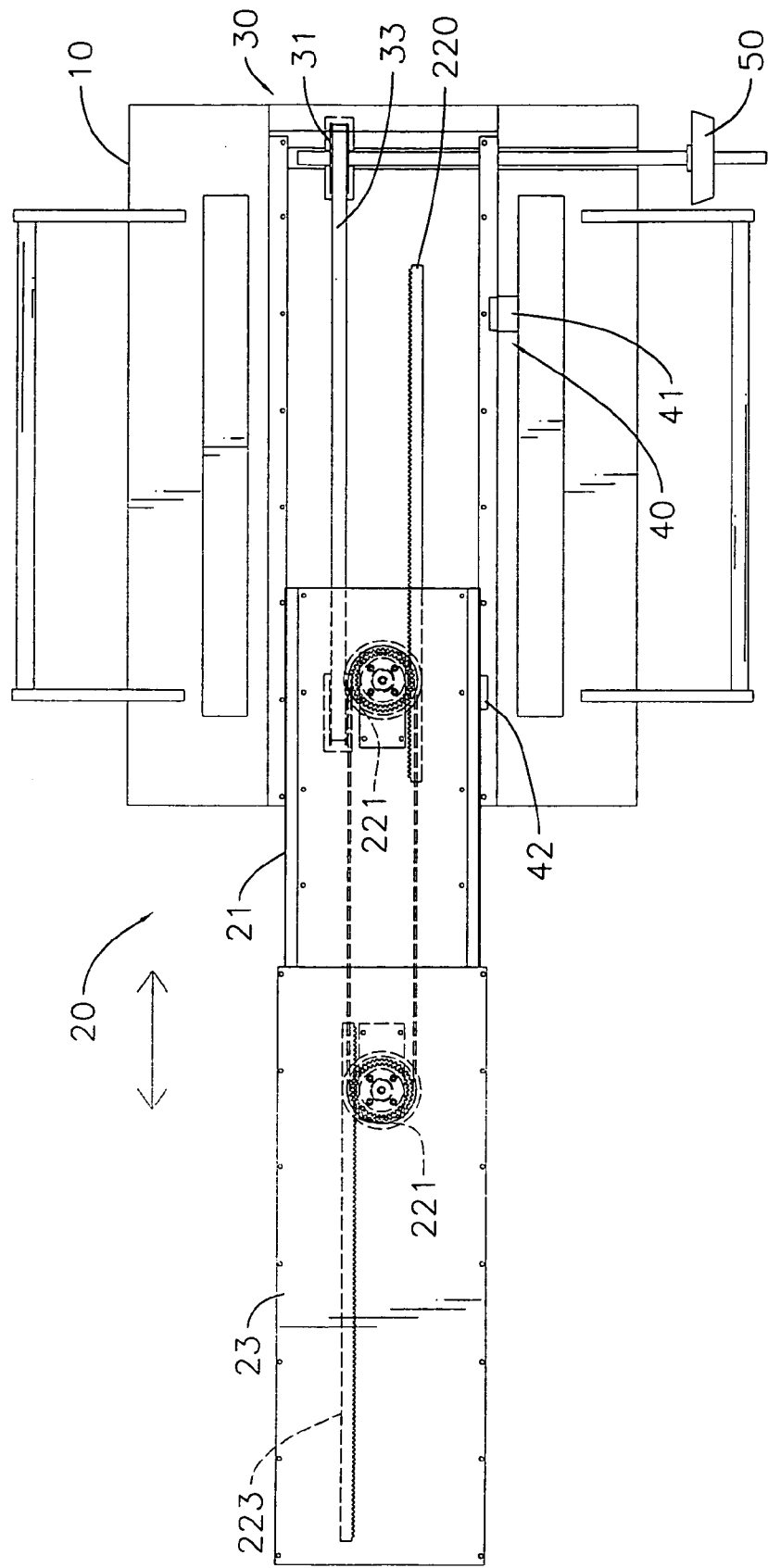
FIG. 3 is an operational top view of the glass substrate carrier in FIG. 1 with the tray of the tray assembly extending out from the base.

With reference to FIGS. 2 and 2A, the connection assembly (22) is mounted between the linkage slide (21) and the tray (23), is connected to the base (10), keeps the tray (23) and the linkage slide (21) simultaneously sliding in a same direction and has a first rack (220), two gear-pulleys (221), a first belt (222) and a second rack (223). The first rack (220) is mounted securely on the top of the base (10). The second rack (223) is mounted securely on bottom of the tray (23). With reference to FIGS. 2A and 3, the gear-pulleys (221) are rotatably mounted respectively on the seat (210) and the cover (211) of the linkage slide (21) and each gear-pulley (221) has a pulley element (2211) and a gear element (2212). The pulley element (2211) is located in the inner cavity in the linkage slide (21). The gear element (2212) is located outside the linkage slide (21). The gear elements (2212) of the gear-pulleys (21) extend respectively through the bottom through hole in the seat (210) and the top through hole in the cover (211). The gear elements (2212) of the gear-pulleys (21) engage respectively with the first rack (220) and the second rack (223) to simultaneously slide the linkage slide (21) and the tray (23) in the same direction. The first belt (222) is mounted around the pulley elements (2211) of the gear-pulleys (221).

The transmission device (30) is mounted between the base (10) and the tray assembly (20), is capable of driving the tray (23) of the tray assembly (20) to extend out from or retract back to the base (10) and has two pulleys (31) and a second belt (33). The pulleys (31) are mounted rotatably on the base (10). The second belt (33) is mounted around the pulleys (31) and is mounted securely on the seat (210) of the linkage slide (21) by fasteners such as rivets and bolts.

Figure 4:
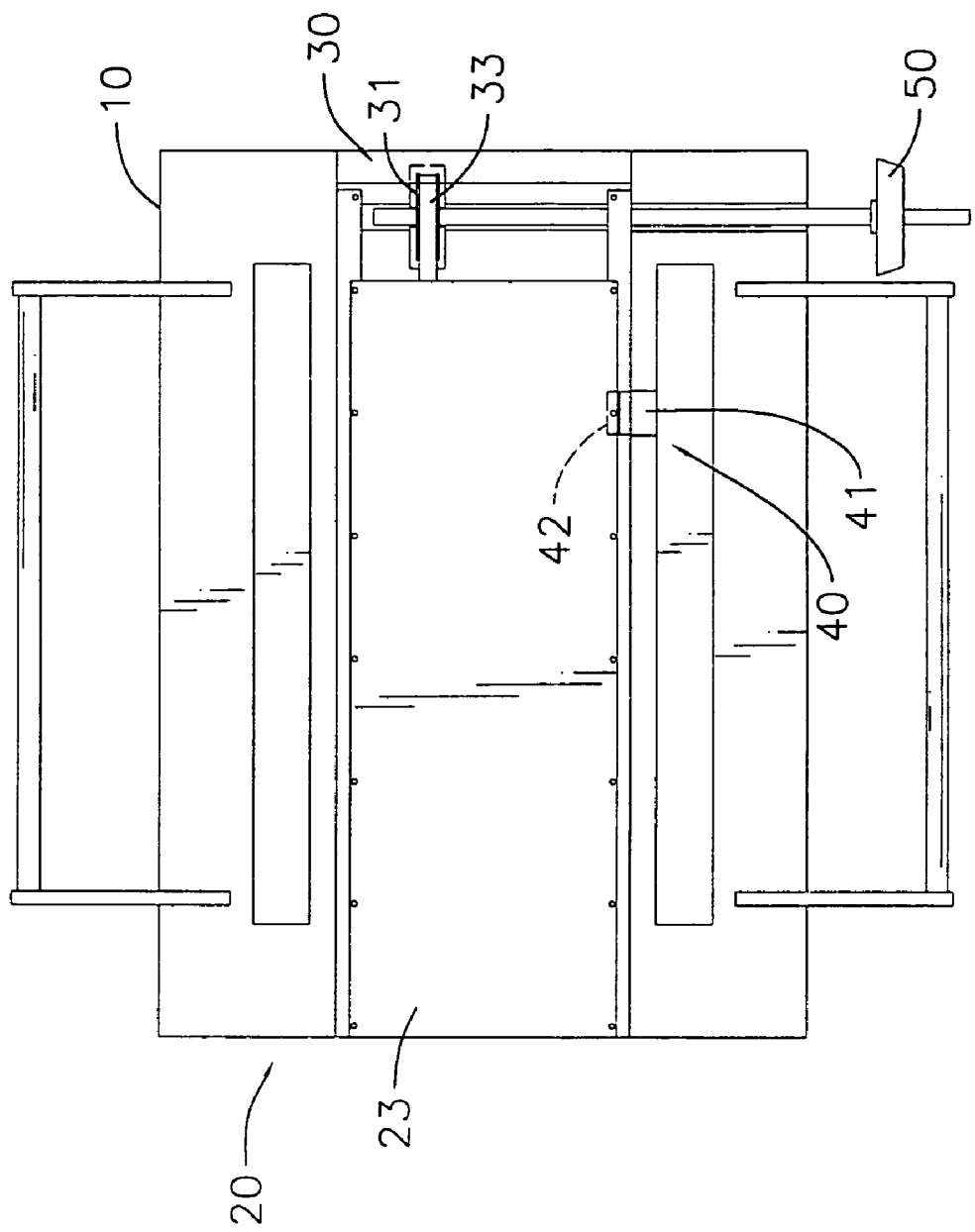
FIG. 4 is a an operational top view of the glass substrate carrier in FIG. 3 with the tray retracting back to the base.

With reference to FIGS. 3 and 4, the non-contact brake assembly (40) is mounted on the base (10) and the tray assembly (20) and has a first brake element (41) and a second brake element (42). The first brake element (41) is mounted on the base (10). The second brake element (42) is mounted on the tray assembly (20), may mounted on one sidewall of the seat (210) of the linkage slide (21) and un-contacts the first brake element (41). The first and second brake elements (41, 42) attract each other with an attractive force to brake a movement of the tray (23) of the tray assembly (22). A preferred embodiment of the non-contact brake assembly (40) has one of the first and second brake elements (41, 42) being a permanent magnet and the other of the first and second brake elements (41, 42) made of metal. The attractive force is an attractive magnetic force. Another preferred embodiment has the first and second brake elements (41, 42) being two attractive permanent magnets.

Figure 5:
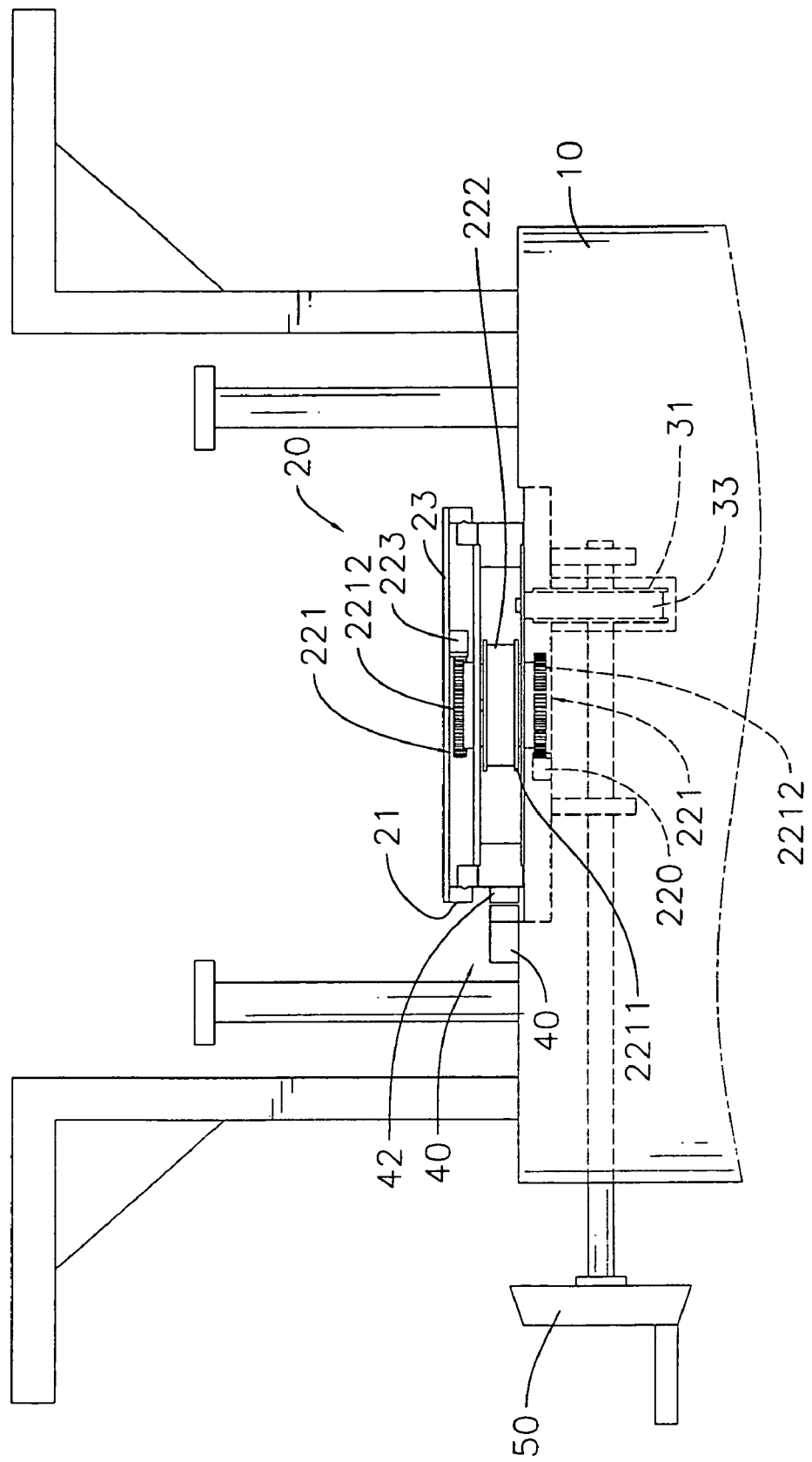
FIG. 5 is a rear view of the glass substrate carrier in FIG. 4.
Figure 6:
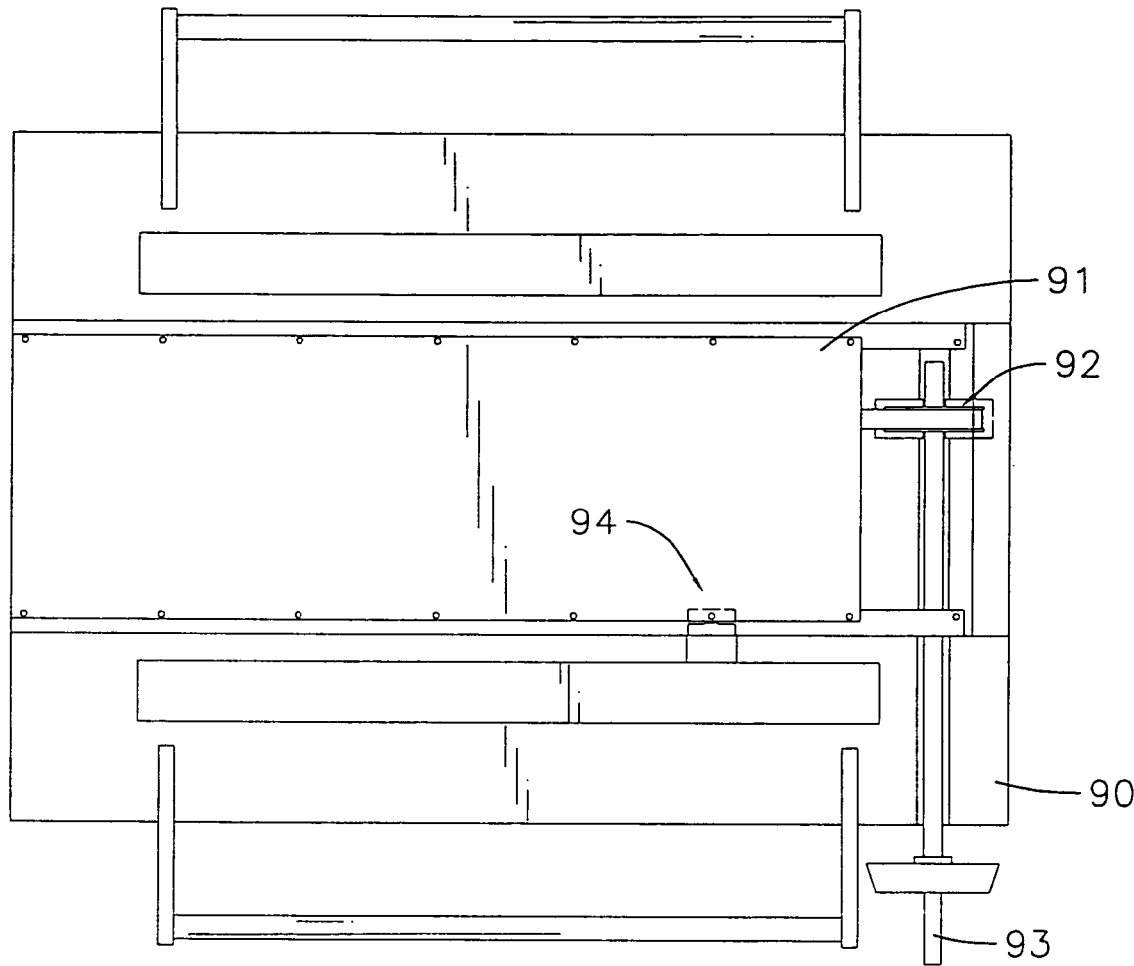
FIG. 6 is a top view of a conventional glass substrate carrier in accordance with the prior art.
Figure 7:
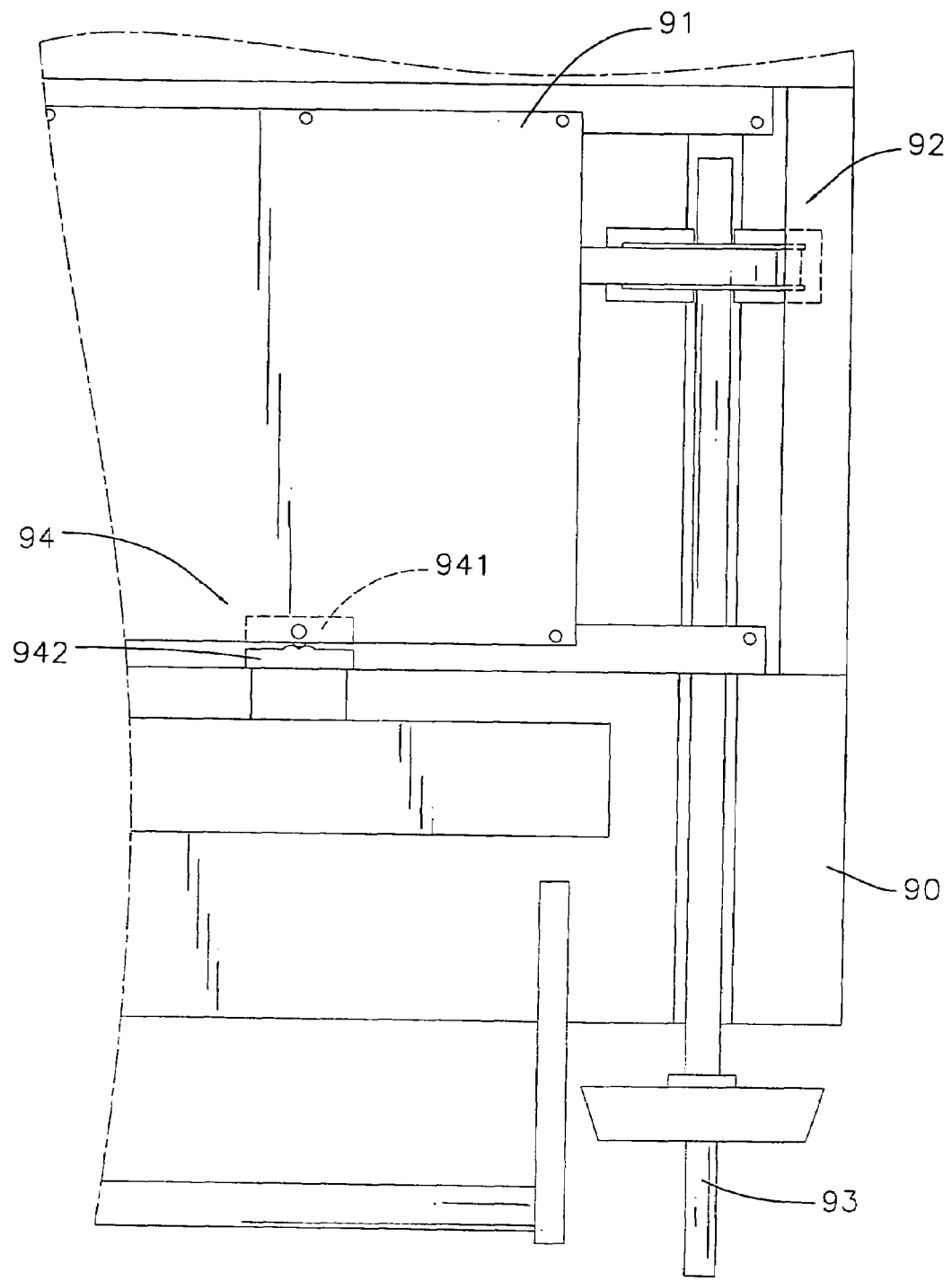
FIG. 7 is an enlarged partial top view of the conventional glass substrate carrier in FIG. 6.

With reference to FIG. 5, the handle (50) is mounted rotatably on the base (10) and is connected to one pulley (31) on the transmission device (30). Rotating the handle (50) drive the transmission device (30) to move the tray assembly (20).

When the tray (23) is manually retracted back to the base (10) by the transmission device (30) and the handle (50), the non-contact brake assembly completely brakes and stops the tray from a low speed.

Because the first and second brake elements (41, 42) attract each other to brake the tray (23) of the tray assembly (20) without contacting each other, the first and second brake elements (41, 42) do not rub against each other and no dust is generated to damage circuit on the glass substrate. Therefore, a production rate of the glass substrate increases.

Even though numerous characteristics and advantages of the present invention have been set forth in the foregoing description, together with details of the structure and function of the invention, the disclosure is illustrative only. Changes may be made in the details, especially in matters of shape, size, and arrangement of parts within the principles of the invention to the full extent indicated by the broad general meaning of the terms in which the appended claims are expressed.

What is claimed is:

1. A glass substrate carrier comprising:
   a base;
   a tray assembly mounted on the base and having a tray slidably mounted on the base and being capable of extending out from or retracting back to the base;
   a transmission device mounted between the base and the tray assembly and being capable of driving the tray to extend out or retract back to the base; and
   a non-contact brake assembly mounted on the base and the tray assembly and having a first brake element mounted on the base and un-contacting a second brake element mounted on the tray assembly, and the first and second brake elements attracting each other with an attractive force to brake a movement of the tray of the tray assembly;
   whereby, when the tray is manually retracted back to the base by the transmission device, the non-contact brake assembly completely brakes and stops the tray from a low speed.

2. The glass substrate carrier as claimed in claim 1, wherein one of the first and second brake elements is a permanent magnet, the other of the first and second brake elements is made of metal and the attractive force is an attractive magnetic force.

3. The glass substrate carrier as claimed in claim 1, wherein the first and second brake elements are two attractive permanent magnets and the attractive force is an attractive magnetic force.

4. The glass substrate carrier as claimed in claim 1, wherein the tray assembly further has:
   a linkage slide mounted slidably on the base and on which the tray is mounted slidably; and
   a connection assembly mounted between the linkage slide and the tray, connected to the base and keeping the tray and the linkage slide simultaneously sliding in a same direction.

5. The glass substrate carrier as claimed in claim 4, wherein the connection assembly has:
   a first rack mounted securely on the base;
   a second rack mounted securely on the tray;
   two gear-pulleys rotatably mounted on the linkage slide and each gear-pulley having a pulley element and a gear element, the gear elements of gear-pulleys engaging respectively with the first rack and the second rack; and
   a first belt mounted around the pulley elements of the gear-pulleys.

6. The glass substrate carrier as claimed in claim 5, wherein the transmission device has:
   two pulleys mounted rotatably on the base; and
   a second belt mounted around the pulleys and mounted securely on the linkage slide.

7. The glass substrate carrier as claimed in claim 6 further comprising a handle mounted rotatably on the base and connected to one pulley on the transmission device.

\* \* \* \* \*